US008357994B1

(12) United States Patent
Habermehl et al.

(10) Patent No.: US 8,357,994 B1
(45) Date of Patent: Jan. 22, 2013

(54) ANTIFUSE WITH A SINGLE SILICON-RICH SILICON NITRIDE INSULATING LAYER

(75) Inventors: Scott D. Habermehl, Corrales, NM (US); Roger T. Apodaca, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 1238 days.

(21) Appl. No.: 11/365,990

(22) Filed: Mar. 1, 2006

(51) Int. Cl.
*H01L 21/425* (2006.01)
(52) U.S. Cl. ............... 257/530; 257/E23.147; 438/476
(58) Field of Classification Search .......... 257/530, 257/50, E23.147, E21.592
See application file for complete search history.

(56) References Cited

U.S. PATENT DOCUMENTS

| | | | | |
|---|---|---|---|---|
| 5,270,251 | A | * | 12/1993 | Cohen ........................... 438/467 |
| 5,550,400 | A | * | 8/1996 | Takagi et al. .................. 257/530 |
| 5,641,703 | A | * | 6/1997 | Cohen et al. .................. 438/467 |
| 7,187,228 | B1 | * | 3/2007 | Jain et al. ...................... 327/525 |
| 7,323,761 | B2 | * | 1/2008 | Park et al. ..................... 257/530 |
| 2002/0028541 | A1 | * | 3/2002 | Lee et al. ...................... 438/149 |
| 2004/0238919 | A1 | | 12/2004 | Brintzinger et al. |

OTHER PUBLICATIONS

D.E. Aspnes, "Optical Properties of Thin Films" Electronics and Optics, Thin Solid Films, vol. 89, 1982, pp. 249-262.
Jonathan Greene et al, "Antifuse Field Programmable Gate Arrays", Proceedings of the IEEE, vol. 81, No. 7, Jul. 1993, pp. 1042-1056.
Simon S. Cohen et al, "A Novel Metal-Insulator-Metal Structure for Field-Programmable Devices," IEEE Transactions on Electron Devices, vol. 40, No. 7, Jul. 1993 pp. 1277-1283.
Yoshimitsu Tamura et al, "Extremely Low ON-resistance Metal-to-Metal Antifuses with Al—Cu/10 nm-thick p—$SiN_x$/Al—Cu structure for Next Generation Very High Speed FPGAs (Field Programmable Gate Arrays)," Japanese Journal of Applied Physics, vol. 35, 1996 pp. 1049-1053.
Sipke J. Bijlsma et al, "Electrical Breakdown of Amorphous Hydrogenated Silicon Rich silicon Nitride Thin Film Diodes," IEEE Transactions on Electron Devices, vol. 43, No. 9, Sep. 1996, pp. 1592-1601.
S. Habermehl et al, "Correlation of charge transport to local atomic strain in Si-rich silicon nitride thin films," Applied Physics Letters, vol. 80 No. 2, Jan. 2002, pp. 261-263.
S. Habermehl et al, "Dielectric breakdown and Poole-Frenkel field saturation in silicon oxynitride thin films," Applied Physics Letters, vol. 86, 2005 pp. 072103-1-072103-3.
S. Habermehl et al, "Onset of Dielectric Breakdown in Silicon Oxynitride Thin Films," Presented at the $207^{th}$ Electrochemical Society Meeting, Quebec City, Canada, May 16-22, 2005.

(Continued)

*Primary Examiner* — Tony Tran
(74) *Attorney, Agent, or Firm* — Olivia J. Tsai

(57) ABSTRACT

An antifuse is disclosed which has an electrically-insulating region sandwiched between two electrodes. The electrically-insulating region has a single layer of a non-hydrogenated silicon-rich (i.e. non-stoichiometric) silicon nitride $SiN_X$ with a nitrogen content X which is generally in the range of $0<X\leq1.2$, and preferably $0.5\leq X\leq1.2$. The breakdown voltage $V_{BD}$ for the antifuse can be defined to be as small as a few volts for CMOS applications by controlling the composition and thickness of the $SiN_X$ layer. The $SiN_X$ layer thickness can also be made sufficiently large so that Poole-Frenkel emission will be the primary electrical conduction mechanism in the antifuse. Different types of electrodes are disclosed including electrodes formed of titanium silicide, aluminum and silicon. Arrays of antifuses can also be formed.

23 Claims, 10 Drawing Sheets

Section 1 - 1

OTHER PUBLICATIONS

Roger T. Apodada, "Electrical Characterization of Silicon-Rich Nitride and Silicon Oxynitride Films Deposited by Low-Pressure Chemical Vapor Deposition," Thesis submitted in Partial Fulfillment of the Requirements for the Degree of Master of Science Electrical Engineering, The University of New Mexico, Albuquerque, NM, Dec. 2005.

* cited by examiner

Section 1 - 1

Section 2 - 2

Section 3 - 3

ANTIFUSE WITH A SINGLE SILICON-RICH SILICON NITRIDE INSULATING LAYER

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to antifuses, and in particular to an antifuses and arrays thereof which have an electrically-insulating layer that comprises a single layer of non-hydrogenated silicon-rich silicon nitride with a layer thickness in which Poole-Frenkel emission preferably dominates over Fowler-Nordheim tunneling as the dominant mechanism for electrical conduction.

BACKGROUND OF THE INVENTION

Typical antifuse devices used in complementary metal-oxide semiconductor (CMOS) technology utilize one or more layers of electrically insulating materials including undoped silicon (Si), stoichiometric silicon nitride ($Si_3N_4$ also referred to as $SiN_{1.33}$) and silicon dioxide ($SiO_2$). To maintain compatibility with standard CMOS circuitry, the write voltage used to program an antifuse by breaking down the insulating material therein should be less than 10 Volts, and preferably less than 5 Volts. Since the breakdown electric field $E_{BD}$ for stoichiometric silicon nitride can exceed 10 MV·cm$^{-1}$, an overall layer thickness for the stoichiometric silicon nitride needs to be less than 10 nanometers (nm). At this layer thickness, electrical conduction in the stoichiometric silicon nitride is dominated by Fowler-Nordheim tunneling rather than by Poole-Frenkel emission. As a result, the onset of electrical breakdown in the thin stoichiometric silicon nitride insulating layer is not due to a well-defined threshold field phenomenon so that a breakdown electric field distribution becomes broadened. One effect of this is that a random occurrence of low-field electrical breakdown events is manifested with breakdown voltage values which can sometimes occur below a specified write voltage for the antifuse. This has obvious detrimental ramifications on circuit reliability.

The present invention overcomes the prior art by providing an antifuse in which the thickness of an electrically-insulating layer can be made sufficiently large for Poole-Frenkel emission to be the dominant mechanism for electrical conduction, while at the same time providing a breakdown electric field $E_{BD}$ which can be adjusted independently of the thickness of the electrically-insulating layer. According to the present invention, this can be done by providing in the electrically-insulating layer a single non-hydrogenated silicon-rich silicon nitride layer whose composition $SiN_X$ can be selected to provide a breakdown voltage of generally $\leq$10 Volts, and preferably $\leq$5 Volts. The non-hydrogenated silicon-rich silicon nitride layer used according to the present invention is a non-stoichiometric composition of silicon nitride which is essentially-hydrogen-free and which has a nitrogen content X which is generally in the range of 0<X$\leq$1.2, and preferably in the range of 0.5$\leq$X$\leq$1.2.

These and other advantages of the present invention will become evident to those skilled in the art.

SUMMARY OF THE INVENTION

The present invention relates to an antifuse which comprises an electrically-insulating region that further comprises a single layer of non-hydrogenated silicon-rich silicon nitride ($SiN_X$) which is 10-50 nanometers thick and has a nitrogen content X in the range 0<X$\leq$1.2, and an electrical breakdown voltage of less than or equal to 10 Volts; and electrodes above and below the electrically-insulating region. For certain preferred embodiments of the present invention, the nitrogen content X can be in the range 0.5$\leq$X$\leq$1.2. For compatibility with CMOS circuitry, the electrical breakdown voltage can be made to be less than or equal to 5 Volts according to the present invention.

At least one of the electrodes can comprise a metal or metal alloy, or silicon. In certain embodiments of the present invention, the electrode below the electrically-insulating region can comprise a metal silicide (e.g. titanium silicide). In these embodiments, the electrode above the electrically-insulating region can also comprise a metal selected from the group consisting of titanium, tungsten, aluminum, copper and alloys thereof.

The present invention also relates to an antifuse which comprises a first electrode formed on a silicon substrate; a single insulating layer deposited over the first electrode, with the single insulating layer being 10-50 nanometers thick, and consisting essentially of a silicon-rich silicon nitride having a composition $SiN_X$ with a nitrogen content X which provides an electrical breakdown voltage less than or equal to 10 Volts; and a second electrode formed over the single insulating layer. The nitrogen content X will generally be in the range 0.5$\leq$X$\leq$1.2. In some embodiments of the present invention, the electrical breakdown voltage can be made to be less than or equal to 5 Volts depending upon the thickness and composition of the $SiN_X$ in the insulating layer.

The antifuse can further comprise an electrical isolation layer deposited over the silicon substrate and having an opening wherein the single insulating layer contacts the first electrode. One or both of the first and second electrodes can comprise either silicon or titanium.

The present invention further relates to an array of antifuses formed on a silicon substrate, with each antifuse comprising an electrically-insulating region that further comprises a single layer of non-hydrogenated silicon-rich silicon nitride ($SiN_X$) 10-50 nanometers thick with a nitrogen content X in the range 0<X$\leq$1.2, and with an electrical breakdown voltage of less than or equal to 10 Volts; and addressing electrodes above and below the electrically-insulating region. For use with CMOS circuitry, the electrical breakdown voltage can be made to be less than or equal to 5 Volts. The nitrogen content X can also be limited to a narrower range of 0.5$\leq$X$\leq$1.2 if desired to reduce the electrical conductivity of the $SiN_X$ layer.

In certain embodiments of the present invention, the addressing electrodes below the electrically-insulating region can comprise a metal silicide (e.g. titanium silicide, or cobalt silicide). The addressing electrodes above the electrically-insulating region can comprise tungsten. In other embodiments of the present invention, one or both of the addressing electrodes can comprise silicon.

The present invention also relates to a method for forming an antifuse on a silicon substrate, comprising the steps of depositing a first electrode over the silicon substrate; depositing an electrical isolation layer over the silicon substrate, and etching an opening through the electrical isolation layer to expose the first electrode; depositing an electrically-insulating layer in the opening over the exposed first electrode, with the electrically-insulating layer further comprising a single non-hydrogenated silicon-rich silicon nitride layer 10-50 nanometers thick having a composition $SiN_X$ with $0<X\leq1.2$; and depositing a second electrode over the electrically-insulating layer.

The electrically-insulating layer can be deposited by low-pressure chemical vapor deposition (LPCVD) using ammonia and dichlorosilane as source gases. Deposition of the electrically-insulating layer by LPCVD can take place at a temperature in the range of 700-850° C., and at a pressure of 500 milliTorr or less.

In certain embodiments of the present invention, the electrically-insulating layer can be deposited with a layer thickness and $SiN_X$ composition that provides an electrical breakdown voltage of ≦10 Volts when a programming voltage is applied between the first and second electrodes. In other embodiments of the present invention, the electrically-insulating layer can be deposited with a layer thickness and $SiN_X$ composition that provides an electrical breakdown voltage of ≦5 Volts. The electrically-insulating layer is preferably deposited with a layer thickness wherein Poole-Frenkel emission dominates over Fowler-Nordheim tunneling as a primary mechanism for electrical conduction.

The $SiN_X$ composition can be determined by measuring the index of refraction of the electrically-insulating layer. A preferred composition of the electrically-insulating layer with $0.5\leq X\leq1.2$ corresponds approximately to an index of refraction n in the range of 2.1-3.0 at a wavelength of 633 nanometers. Therefore, the electrically-insulating layer can be deposited with the composition $SiN_X$ selected to have an index of refraction in the range of 2.1-3.0 at 633 nanometers.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1A:
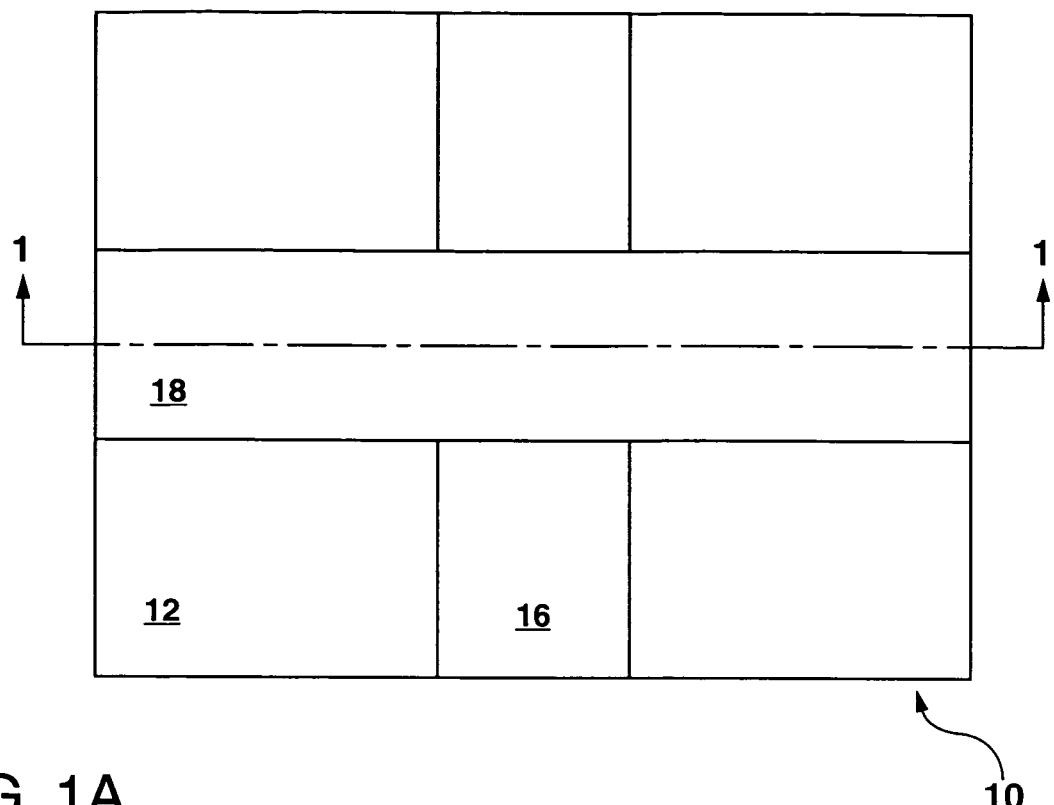
FIG. 1A shows a schematic plan view of a first example of an antifuse formed according to the present invention.
Figure 1B:
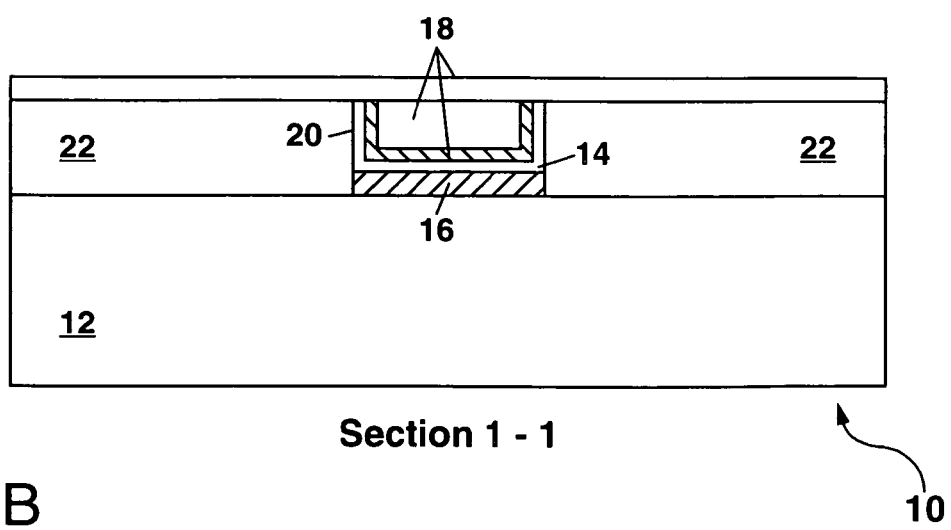
FIG. 1B shows a schematic cross-section view of the antifuse in FIG. 1A along the section line 1-1 in FIG. 1A.

Referring to FIGS. 1A and 1B, there is shown schematic plan and cross-section views, respectively, of a first example of an antifuse 10 according to the present invention. The antifuse 10 can be formed on a silicon substrate 12 as a part of an antifuse array 30 (see FIG. 10) which can be programmed to configure electrical connections within a complementary metal-oxide semiconductor (CMOS) application specific integrated circuit (ASIC) formed on the same silicon substrate 12.

In FIGS. 1A and 1B, the antifuse 10 comprises an electrically-insulating region 14 sandwiched between a lower electrode 16 and an upper electrode 18. The antifuse 10 can be formed within an opening 20 etched through an electrical isolation layer 22 comprising silicon dioxide ($SiO_2$) or a silicate glass (e.g. TEOS deposited from the decomposition of tetraethylortho silicate using low-pressure chemical vapor deposition or plasma-enhanced chemical vapor deposition). In FIG. 1A, the electrical isolation layer 22 is depicted as being transparent in order to show the location of the lower electrode 16 which can be extended beyond the opening 20 to form wiring for making an electrical connection to the lower electrode 16.

In the example of FIG. 1, the lower electrode 16 can comprise, for example, titanium or a metal silicide such as titanium silicide or cobalt silicide which can also be used as a contact metallization on CMOS transistors in the ASIC. The upper electrode 18 can be formed as part of a first interconnect metallization (i.e. wiring) for the CMOS ASIC. As an example, the upper electrode 18 can include layers of titanium and titanium nitride which can be deposited to line the bottom and sidewalls of the opening 20 and to contact an upper surface of the electrically-insulating layer 14. Tungsten can then be deposited to overfill the opening 20, with the tungsten then being planarized by chemical-mechanical polishing back to the level of the electrical isolation layer 22. An aluminum-copper alloy (e.g. comprising 1% copper) can then be deposited and patterned to complete the upper electrode 18 and form a first level of interconnect metallization for the CMOS ASIC. These metals and metal alloys can be deposited by well-known methods including evaporation, sputtering and chemical vapor deposition.

The term "substrate" as used herein can refer to a bulk silicon substrate or to a silicon-on-insulator substrate. The term "substrate" as used herein can further include a silicon device layer wherein CMOS transistors are formed and also a thermal oxide layer which can be initially formed over a top surface of the silicon substrate 12 to electrically isolate the silicon substrate 12 from the lower electrode 16 when the lower electrode 16 is not formed from the silicon substrate 12. The term "silicon-rich silicon nitride" as used herein refers to a non-stoichiometric silicon nitride composition in which the ratio of nitrogen to silicon is less than or equal to 1.2 and is greater than zero.

In the example of FIG. 1, the electrically-insulating region 14 comprises a single homogeneous layer of non-hydrogenated silicon-rich silicon nitride $SiN_X$ with a nitrogen content X which is generally in the range of $0 < X \leq 1.2$ and preferably in the range of $0.5 \leq X \leq 1.2$. The exact composition $SiN_X$ used in the electrically-insulating region 14 to provide a predetermined breakdown voltage $V_{BD}$ will depend upon the thickness of the $SiN_X$ layer, and can also depend upon the composition of the lower electrode 16 (e.g. when a thin oxide layer forms on a surface of the lower electrode 16 during deposition of the $SiN_X$ layer at an elevated temperature).

The $SiN_X$ layer can be deposited by low-pressure chemical vapor deposition (LPCVD) using ammonia and dichlorosilane as source gases. Deposition of the $SiN_X$ layer by LPCVD can take place at an elevated temperature in the range of 700-850° C., and at a pressure of 500 milliTorr or less (e.g. 200-300 milliTorr). The deposition rate for the $SiN_X$ in the electrically-insulating layer 14 can be, for example, 1-5 nm per minute. By depositing the $SiN_X$ layer at a high temperature, very little, if any, hydrogen is expected to be present in the $SiN_X$ layer.

Figure 2:
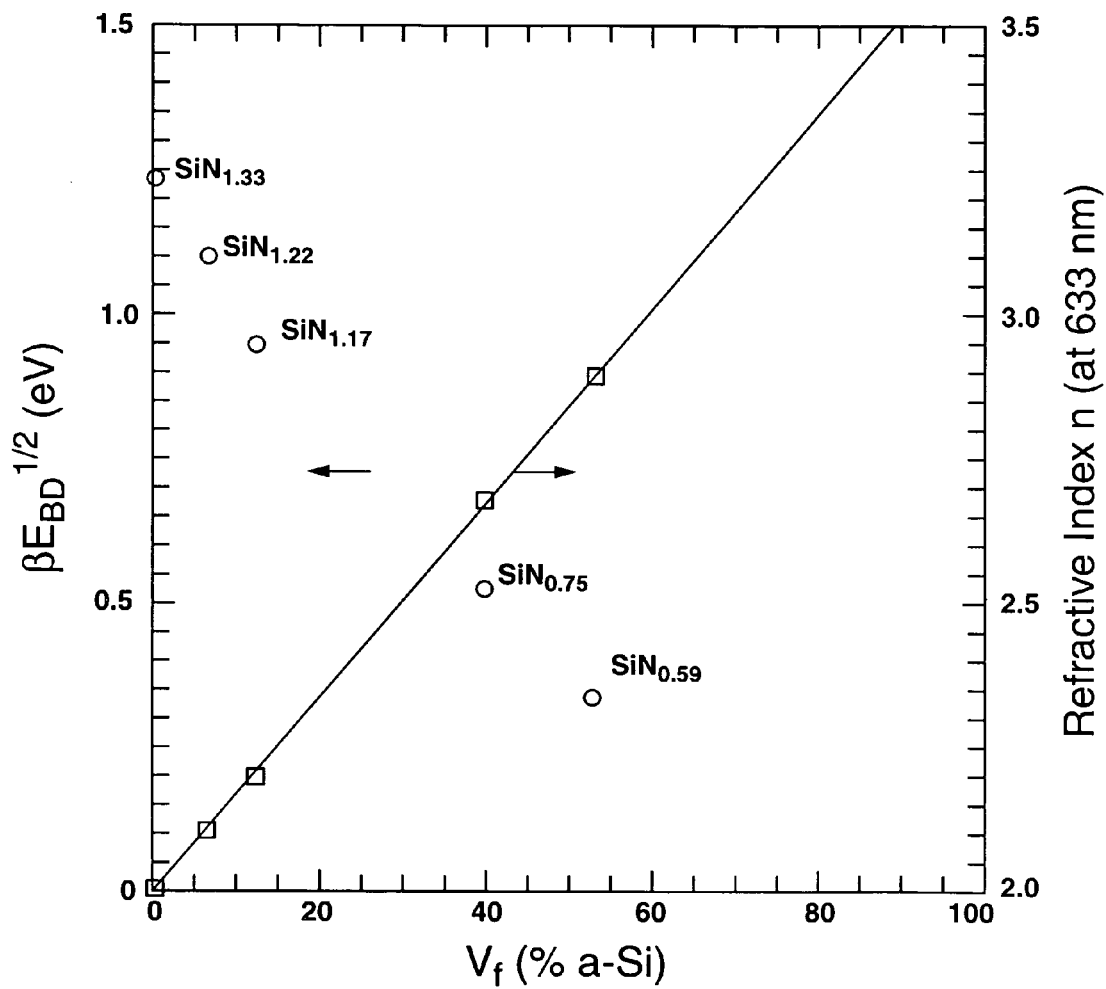
FIG. 2 shows the dependence of the barrier lowering energy at electrical breakdown $\beta E_{BD}^{1/2}$ and the refractive index n on the volume fraction $V_f$ of amorphous silicon in the $SiN_X$ layer within the various examples of the antifuses 10 of the present invention. The circles represent calculated values for the barrier lowering energy at electrical breakdown $\beta E_{BD}^{1/2}$; and the squares represent measurements of the refractive index n for the same $SiN_X$ layers made using a variable angle ellipsometer.

The $SiN_X$ composition can be determined by measuring the index of refraction of the electrically-insulating layer 14 using ellipsometry after deposition of the layer 14. A preferred composition of the $SiN_X$ in the electrically-insulating layer 14 with $0.5 \leq X \leq 1.2$ corresponds approximately to an index of refraction n in the range of 2.1-3.0 at a wavelength of 633 nanometers. The refractive index n for several $SiN_X$ compositions in the preferred range of $0.5 \leq X \leq 1.2$ is shown in FIG. 2 as square data points with the solid line being a linear fit to the data. The refractive index n can be seen in FIG. 2 to depend linearly on the volume fraction $V_f$ of amorphous silicon in the $SiN_X$ electrically-insulating layer 14. The volume fraction $V_f$ of a-Si for the various compositions of the $SiN_X$ layer in FIG. 2 was calculated from ellipsometric measurements made with a variable angle ellipsometer using the Bruggeman effective medium approximation (see e.g. D. E. Aspnes, "Optical Properties of Thin Films," *Thin Film Solids*, vol. 89, pp. 249-262, 1982). The refractive index curve in FIG. 2 can be used to determine other compositions of $SiN_X$ used for the antifuse 10 of the present invention. Furthermore, the step of depositing the electrically-insulating layer 14 can be performed by LPCVD by depositing the layer 14 to provide an index of refraction n which is generally in the range of 2.1-3.5, and preferably in the range of 2.1-3.0 at 633 nm.

Figure 3:
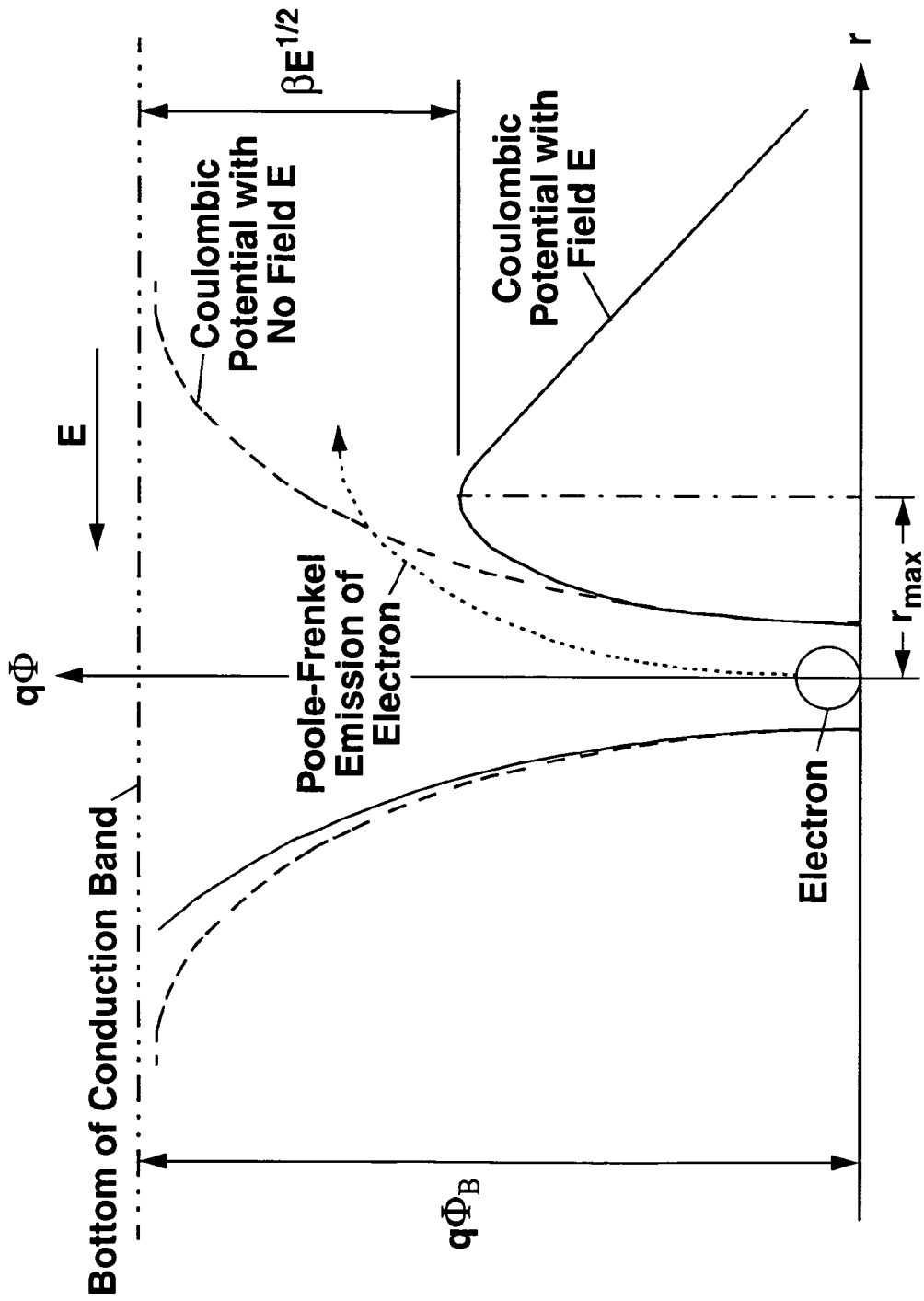
FIG. 3 shows an energy band diagram of an electron trapped in a coulombic potential well in the electrically-insulating layer before and after an electric field E is applied to illustrate the lowering of the coulombic potential produced by the electric field E which allows for Poole-Frenkel emission of the electron.

Electrical conduction through the electrically-insulating region 14 due to Poole-Frenkel emission is a process of bulk trap-regulated field-enhanced thermionic emission in which electrons within the bulk of the electrically-insulating region 14 are emitted over the top of a coulombic potential barrier $q\Phi_B$ that is lowered in the presence of an electric field E applied across the region 14 by the electrodes 16 and 18. This is schematically illustrated in FIG. 3 which shows a coulombic potential well experienced by an electron located within a trap in the electrically-insulating region 14 in the absence of any applied electric field E (dashed line), and the lowering of the coulombic potential barrier $q\Phi_B$ produced by the applied electric field E. This lowering of the coulombic potential barrier $q\Phi_B$ by an amount equal to a barrier lowering energy $\beta E^{1/2}$ increases the probability that the electron can be emitted over the lowered coulombic potential barrier by Poole-Frenkel emission as shown in FIG. 3. Fowler-Nordheim tunneling, on the other hand, is a process whereby an electron tunnels through a potential energy barrier of a thin electrical insulator in the presence of a high electric field.

In FIG. 3, the electric-field-dependent barrier lowering $\beta E^{1/2}$, which enhances the probability for thermal emission of electrons from coulombic charge traps in the electrically-insulating region 14, produces an exponential increase in the electrical conductivity a with increasing electric field E. The current density J=σE for Poole-Frenkel emission, which depends on both electric field E and temperature T, is given by:

$$J(E, T) = C_1 E e^{-q(\Phi_B - \sqrt{qE/\pi\in\in_0})/\xi kT}$$

where $C_1$ is a pre-exponential factor dependent upon the carrier mobility and charge trap density in the $SiN_X$ layer, $q\Phi_B$ is the charge trap potential depth (assumed to be monoenergetic), $\in_0$ is the permittivity of free space, $\in$ is the dielectric constant of the $SiN_X$ layer, and ξ is an acceptor compensation factor which ranges from 1-2 depending on the position of the Fermi level in the $SiN_X$ layer. In the above equation, the second term in the exponent gives a barrier lowering energy $\beta E^{1/2}$ where β is given by:

$$\beta = \sqrt{q^3/\pi\in\in_0}.$$

FIG. 2 shows the dependence of the barrier lowering energy $\beta E_{BD}^{1/2}$ at the breakdown voltage $V_{BD}$ for the $SiN_X$ layer as a function of the volume fraction $V_f$ by percent of amorphous silicon (a-Si) in the $SiN_X$ layer. In FIG. 2, calculated data points for the barrier lowering energy $\beta E_{BD}^{1/2}$ for a number of different compositions of the $SiN_X$ layer are shown as open circles. The exact dependence of the barrier lowering energy $\beta E_{BD}^{1/2}$ on the volume fraction $V_f$ of a-Si is not well known at this point.

Figure 4:
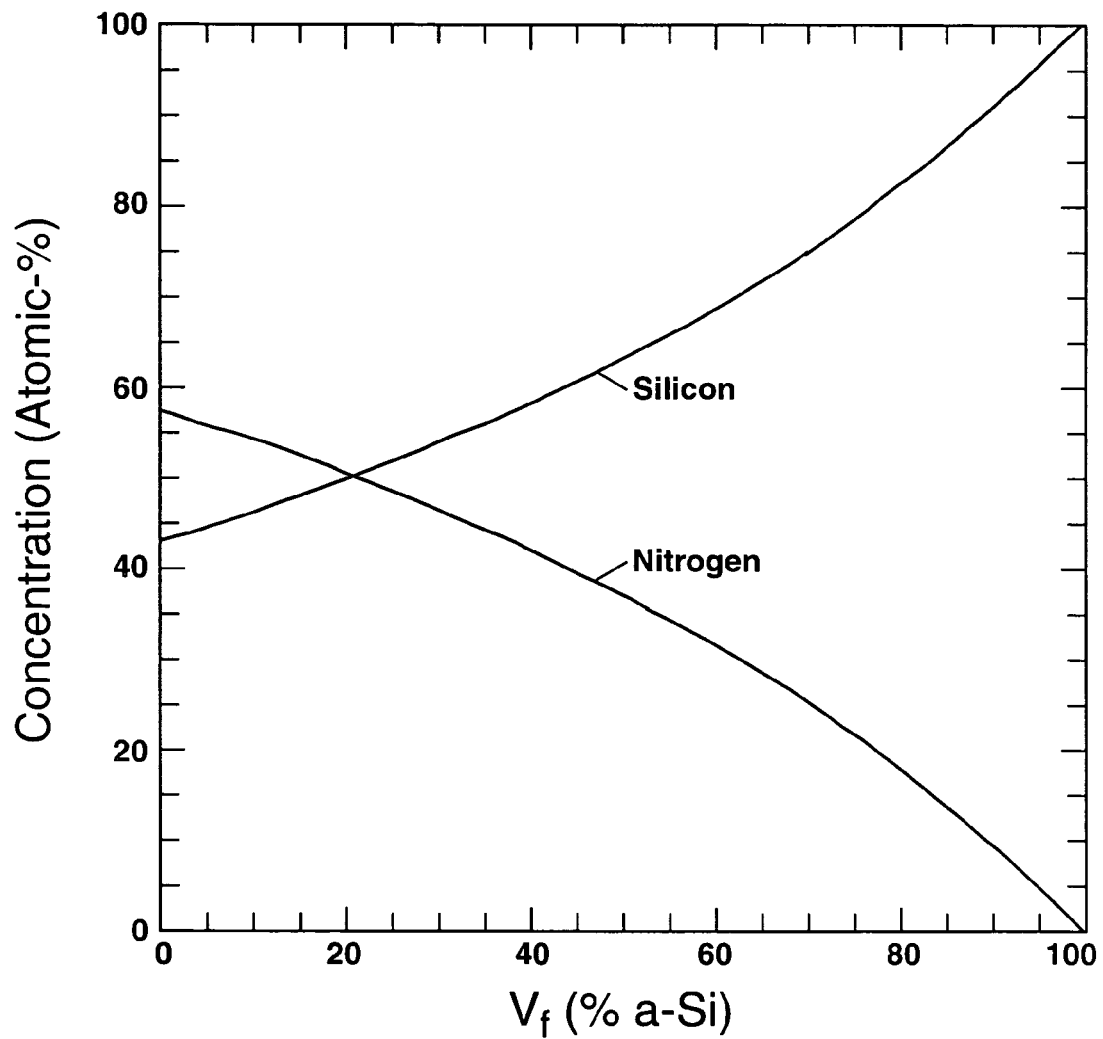
FIG. 4 shows calculated curves to illustrate the relationship between the volume fraction $V_f$ of amorphous silicon in a $SiN_X$ layer and the silicon and nitrogen concentration in terms of atomic-percent in the $SiN_X$ layer. Note that the nitrogen concentration in FIG. 4 is not the same as the nitrogen content X.

The use of the volume fraction $V_f$ of a-Si to characterize the electrically-insulating region 14 considers this region 14 as a stoichiometric silicon nitride layer (i.e. $SiN_{1.33}$) to which amorphous silicon (a-Si) has been added to provide an overall non-stoichiometric silicon-rich composition $SiN_X$. The nitrogen content X in the single $SiN_X$ layer in the electrically-insulating region 14 is generally in the range of $0 < X \leq 1.2$, and preferably being in the range of $0.5 \leq X \leq 1.2$. FIG. 4 is a graph shows the correlation between the amorphous silicon volume fraction $V_f$ and the concentration of nitrogen and silicon in terms of atomic percent for the $SiN_X$ layer calculated using the Bruggeman effective medium approximation.

When the barrier lowering energy $\beta E_{BD}^{1/2}$ is within about 2 kT of $q\Phi_B$, where k is Boltzmann's constant and T is the absolute temperature (° K), then a sufficient flow of charge carriers can be produced to lead to electrical breakdown of the electrically-insulating region 14. The threshold condition for the onset of electrical breakdown, termed Poole-Frenkel field saturation, occurs in stoichiometric silicon nitride (i.e. $SiN_{1.33}$) at an electric field $E_{BD}$ which is in excess of 10 MV-cm$^{-1}$. This is a consequence of values for $q\Phi_B$ which are greater than 1.2 electron Volts (eV) and a dielectric constant $\in = n^2$ which is about 4.0. In order to use stoichiometric silicon nitride in an antifuse device, it is necessary to reduce the layer thickness to induce breakdown at a sufficiently low applied voltage $V_{BD}$. The difficulty with this is that for a layer thickness which is below 10-20 nm stoichiometric silicon nitride exhibits Fowler-Nordheim tunneling rather than Poole-Frenkel emission as the dominant charge conduction mechanism. In this regime, the onset of electrical breakdown is no longer a well-defined threshold electric field phenomenon, and the breakdown voltage $V_{BD}$ distribution broadens which becomes problematic for reliability in an antifuse.

The use of silicon-rich (i.e. non-stoichiometric) silicon nitride instead of stoichiometric silicon nitride as disclosed herein can overcome this problem and make Poole-Frenkel emission the primary charge conduction mechanism. Additionally, the use of silicon-rich silicon nitride $SiN_X$ with $0 < X \leq 1.2$ can lower the breakdown electric field $E_{BD}$ so that a thicker electrically-insulating layer (e.g. 20-50 nm thick) can be used to provide a predetermined breakdown voltage $V_{BD}$.

Figure 5:
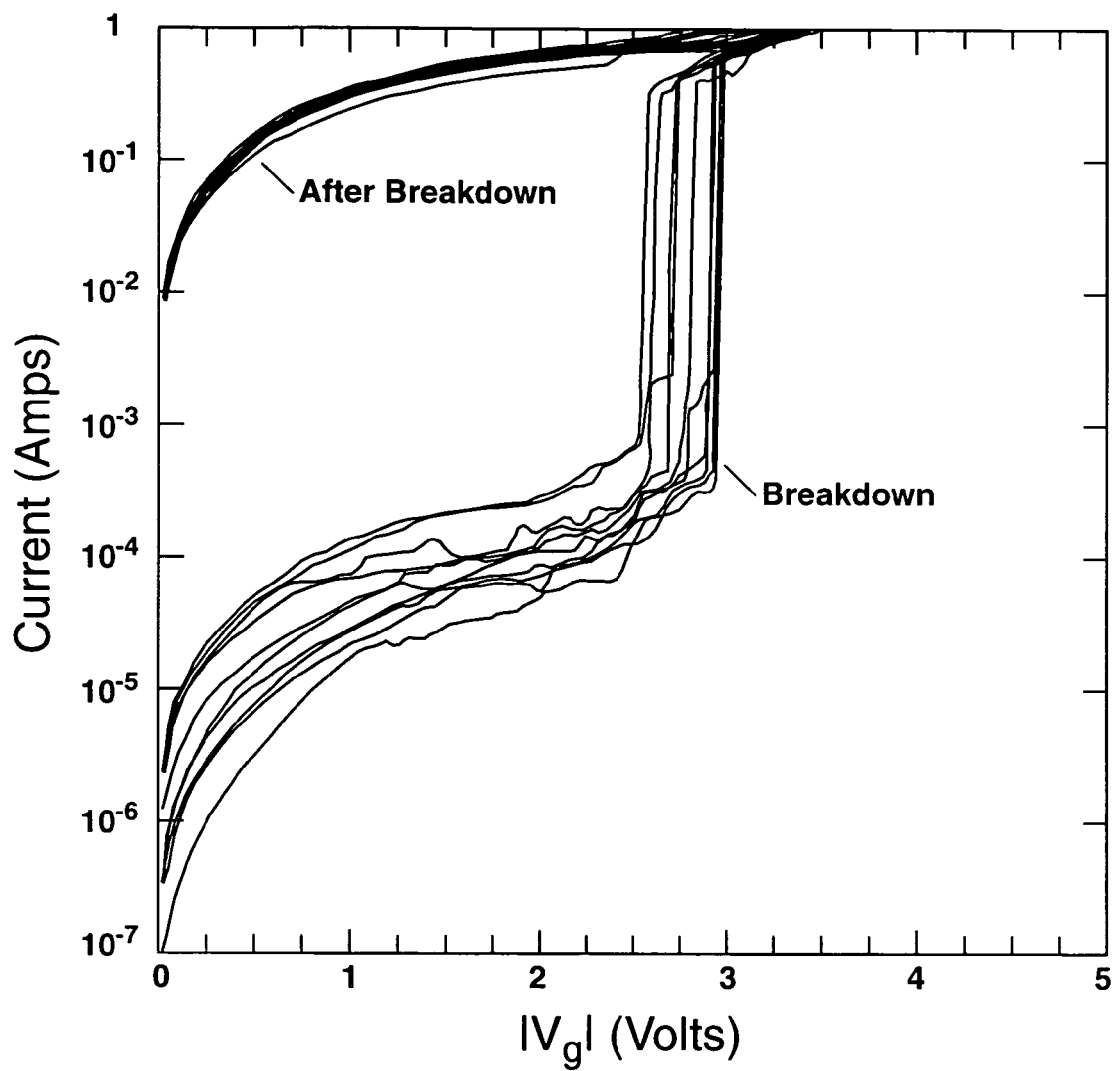
FIG. 5 shows two series of current-vs-voltage (I-V) curves, with one series of I-V curves taking during electrical breakdown and with the other series of I-V curves taken after electrical breakdown. A total of ten antifuses were measured, with each antifuse having a single 40-nm-thick non-hydrogenated $SiN_X$ layer with X=0.59 sandwiched between a titanium silicide lower electrode and an upper electrode comprising aluminum.

FIG. 5 shows a series of room-temperature current-vs-voltage curves for an antifuse 10 similar to that of FIGS. 1A and 1B with an electrically-insulating layer 14 comprising a single 40-nm thick layer of $SiN_{0.59}$ with a refractive index n=2.9 at a wavelength of 633 nm, with a titanium silicide lower electrode 16, and with an upper electrode 18 comprising aluminum (e.g. an aluminum-1% copper alloy). In FIG. 5, ten devices 10 were tested to electrical breakdown. Although the antifuses 10 tested in FIG. 5 had a relatively large area of $1.4 \times 10^{-3}$ cm$^2$, the antifuses 10 of the present invention can be made as small as one micron on a side or less.

To obtain the curves shown in FIG. 5, a voltage $V_g$ is applied across the electrodes 16 and 18 of each antifuse 10 and increased at a rate of about 1 MegaVolt-cm$^{-1}$-sec$^{-1}$ while the leakage current through the electrically-insulating layer 14 is measured. As the voltage across each antifuse 10 increases, the current through the antifuse 10 steadily increases until an abrupt breakdown of the electrically-insulating region 14 occurs when the electric field produced by the applied voltage $V_g$ becomes large enough to drive the barrier lowering energy $\beta E_{BD}^{1/2}$ within about 2 kT of $q\Phi_B$ as described previously. This abrupt breakdown, which is characterized by a nearly vertical line segment in each current-vs-voltage curve in FIG. 5 at a voltage of about 2.6-3 Volts, is termed the breakdown voltage $V_{BD}$. The current-vs-voltage curves obtained during initial testing of the antifuses 10 to breakdown are indicated by the label "Breakdown" in FIG. 5. Once electrical breakdown of the electrically-insulating region 14 occurs, there is an irreversible change due to localized melting of the electrode material which penetrates through the electrically-insulating region 14 to form a low-impedance current path between the electrodes 16 and 18. This low-impedance current path can be seen in the curves in FIG. 5 labelled "After Breakdown" which show the resistance of the antifuses 10 after breakdown to be on the order of a few Ohms for an applied voltage above 1 Volt.

In FIG. 5, the curves are shown plotted against the absolute value of the applied voltage $V_g$. This convention is used since for Poole-Frenkel emission the electrical conductivity through the antifuse 10 and the breakdown voltage $V_{BD}$ do not depend strongly upon the polarity of the voltage $V_g$ across the electrodes 16 and 18.

As previously discussed, the breakdown voltage $V_{BD}$ depends upon on the nitrogen content X in the single non-hydrogenated silicon-rich $SiN_X$ layer in the electrically-insulating region 14 and also on the layer thickness of the $SiN_X$ layer. For the current-vs-voltage curves in FIG. 5 the average breakdown voltage $V_{BD}$ is 2.85 Volts. For another ten devices 10 having the same area and $SiN_X$ composition as those in FIG. 5, but with a smaller $SiN_X$ layer thickness of 30 nm, the average breakdown voltage $V_{BD}$ is reduced to 2.54 Volts. And, for yet another ten devices 10 of the same area and $SiN_X$ composition but with a still smaller $SiN_X$ layer thickness of 20 nm, the average breakdown voltage $V_{BD}$ is reduced to 2.40 Volts.

Figure 6A:
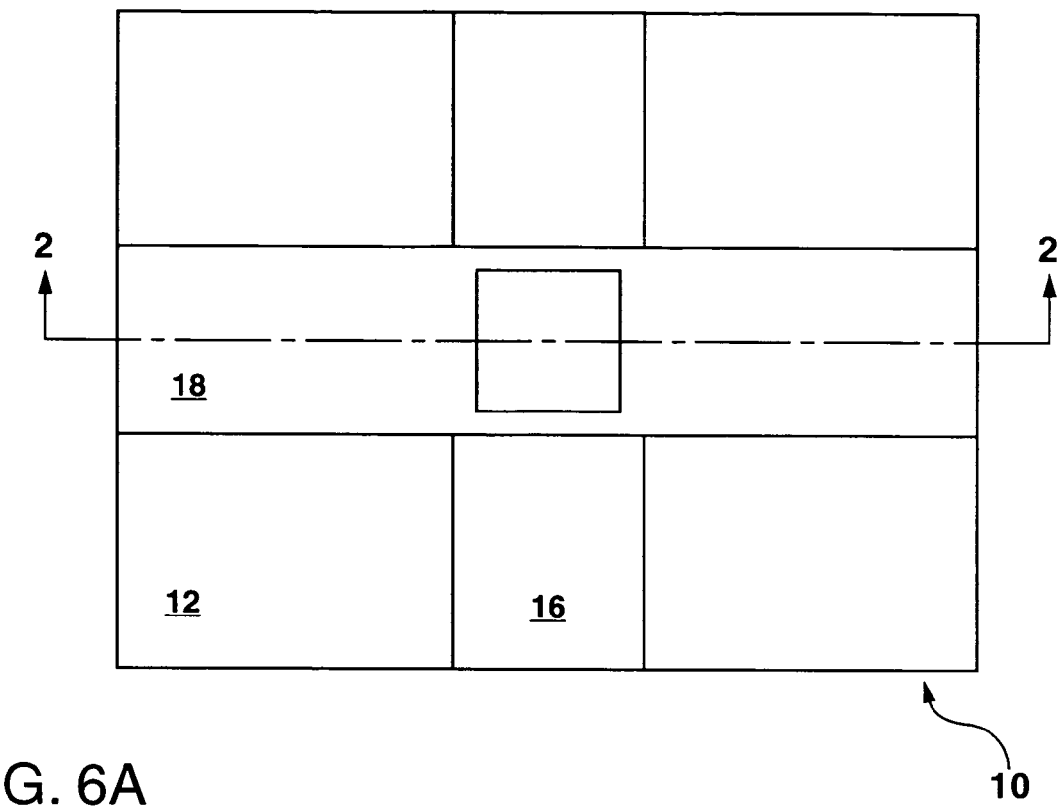
FIG. 6A shows a schematic plan view of a second example of an antifuse formed according to the present invention.
Figure 6B:
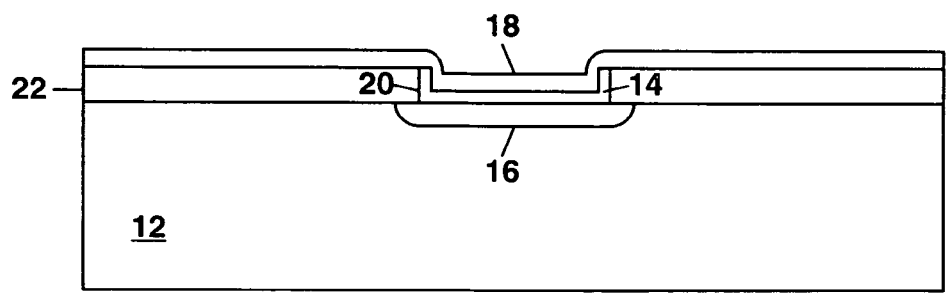
FIG. 6B shows a schematic cross-section view of the antifuse in FIG. 6A along the section line 2-2 in FIG. 5A.

FIGS. 6A and 6B show schematic plan and cross-section views, respectively, of a second example of the antifuse 10 of the present invention. In this example of the present invention, the lower electrode 16 comprises a doped region of a silicon substrate, or alternately a doped silicon substrate. The upper electrode 18 in FIGS. 6A and 6B comprises a deposited layer of doped polycrystalline silicon (also termed polysilicon) which can be patterned after deposition using reactive ion etching. The silicon substrate can be locally doped n-type (e.g. with phosphorous), or p-type (e.g. with boron). The lower electrode 16 can be oppositely doped with respect to the substrate 12 to form in combination therewith a reverse-biased semiconductor p-n junction that electrically isolates the lower electrode 16 from the substrate 12. Alternately, the lower electrode 16 can be doped the same n-type or p-type as the substrate 12 when the lower electrode 16 is to be electrically connected to the substrate 12. The polysilicon upper electrode 18 can be doped n-type or p-type during deposition by LPCVD at a temperature of about 580° C., and can be optionally overcoated with a layer of metal (e.g. an aluminum-1% copper alloy). The electrical isolation layer 22 is shown as being transparent in FIG. 6A to show the location of the lower electrode 16 which can be elongated to form electrical wiring to provide an electrical connection to the antifuse 10 (e.g. to connect the antifuse 10 to a contact pad, to additional antifuses 10, or to integrated circuitry on the substrate 12).

The composition of the single non-hydrogenated silicon-rich $SiN_X$ layer in the electrically-insulating region 14 in the example of FIGS. 6A and 6B can be as previously described with X generally being given by $0 < X \leq 1.2$ and preferably by $0.5 \leq X \leq 1.2$. With the electrodes 16 and 18 comprising silicon, the measured breakdown voltages $V_{BD}$ for the antifuses 10 having a given $SiN_X$ layer composition and thickness are about twice that measured for the antifuses 10 in FIG. 5 with a titanium silicide lower electrode 16. The exact reason for this is unknown, although the antifuses 10 tested in FIG. 7 had a much smaller size of 2.3 μm×0.3 μm; and a high-temperature annealing step was used to reduce any stress in the deposited polysilicon upper electrode 18. Additionally, some oxidation was observed on the surface of the titanium silicide lower electrode 16 in the antifuses 10 in FIG. 5, with this oxidation presumably being due to the high temperature used for deposition of the $SiN_X$ layer.

Figure 7:
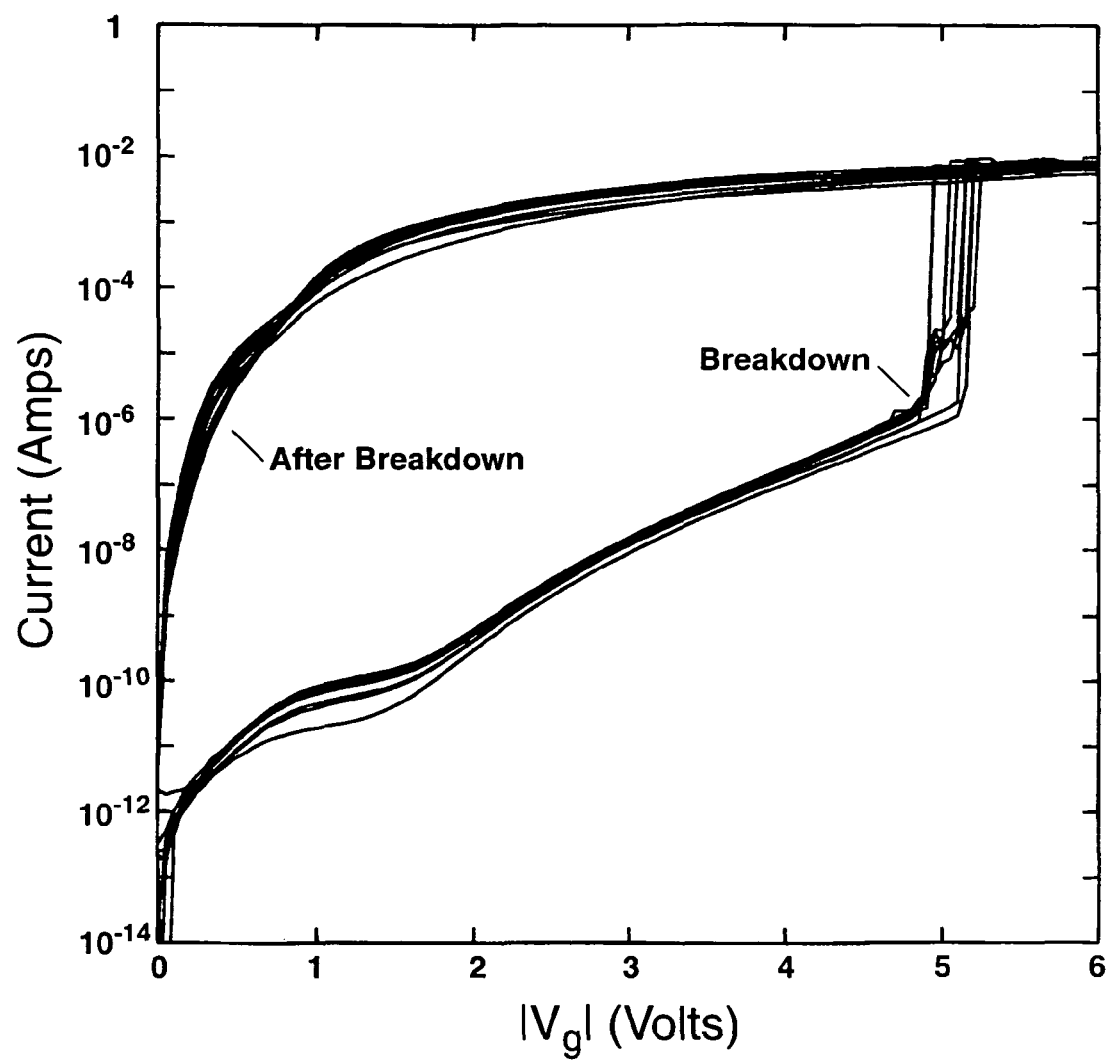
FIG. 7 shows I-V curves measured during and after electrical breakdown for ten antifuses having a single 20-nm-thick non-hydrogenated $SiN_X$ layer with X=0.59 sandwiched between a silicon lower electrode and an upper electrode comprising polycrystalline silicon.

FIG. 7 shows a series of room-temperature current-vs-voltage curves for antifuses 10 having a doped silicon lower electrode 16 formed by a p$^+$-doped silicon substrate 12 (uniformly doped throughout with boron), with the substrate 12 having a full-surface aluminum backside contact. The polysilicon upper electrode 18 is n-type doped with phosphorous. A series of ten antifuses 10 were tested with the single $SiN_X$ layer being 20 nm thick and having a nitrogen content X=0.59 and a refractive index n=2.9. The average breakdown voltage for the antifuses 10 in FIG. 7 is about 5.1 Volts.

In general, decreasing the nitrogen content X in the electrically-insulating layer 14 will decrease the breakdown voltage $V_{BD}$ for the antifuses 10 of the present invention. Alternately, the breakdown voltage $V_{BD}$ can be reduced by reducing the thickness of the electrically-insulating layer 14.

Figure 8A:
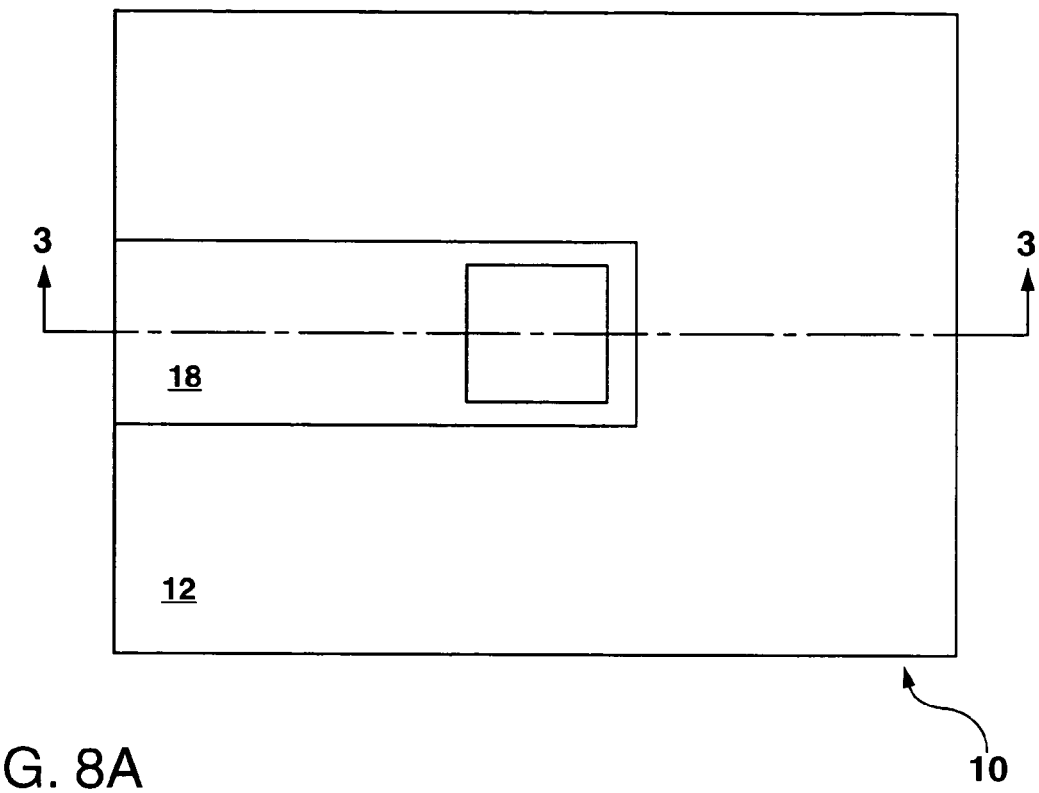
FIG. 8A shows a schematic plan view of a third example of an antifuse formed according to the present invention.
Figure 8B:
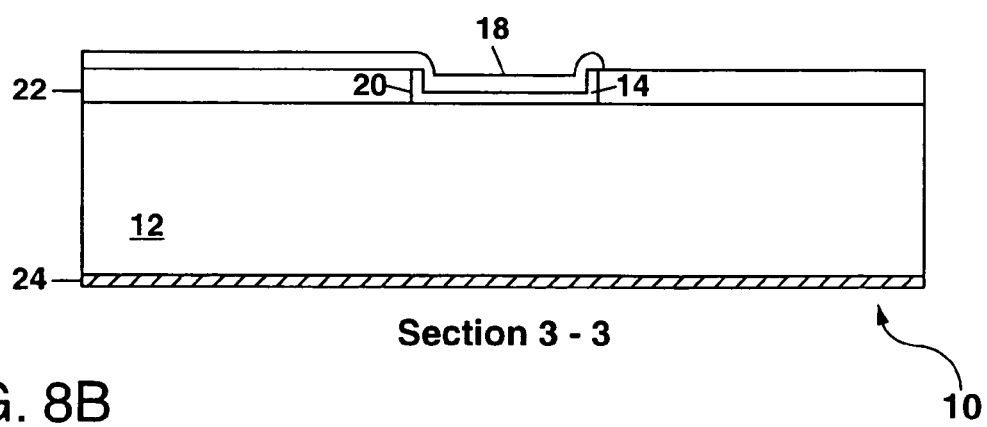
FIG. 8B shows a schematic cross-section view of the antifuse of FIG. 7A along the section line 3-3 in FIG. 7A.

FIGS. 8A and 8B show a third example of the antifuse 10 of the present invention with the lower electrode 16 being formed by a p$^+$-doped semiconductor substrate 12 having a full-surface aluminum backside contact 24. The electrically-insulating layer comprises a single layer of SiN$_{0.75}$ which is 15 nm thick and which has a refractive index n=2.67. The upper electrode 18 comprises aluminum (e.g. an aluminum −1% copper alloy). An extension of the upper electrode 18 beyond the opening 20 through the electrical isolation layer 22 can be used to form wiring which can be connected to a contact pad, or to integrated circuitry formed on the substrate 12.

Figure 9:
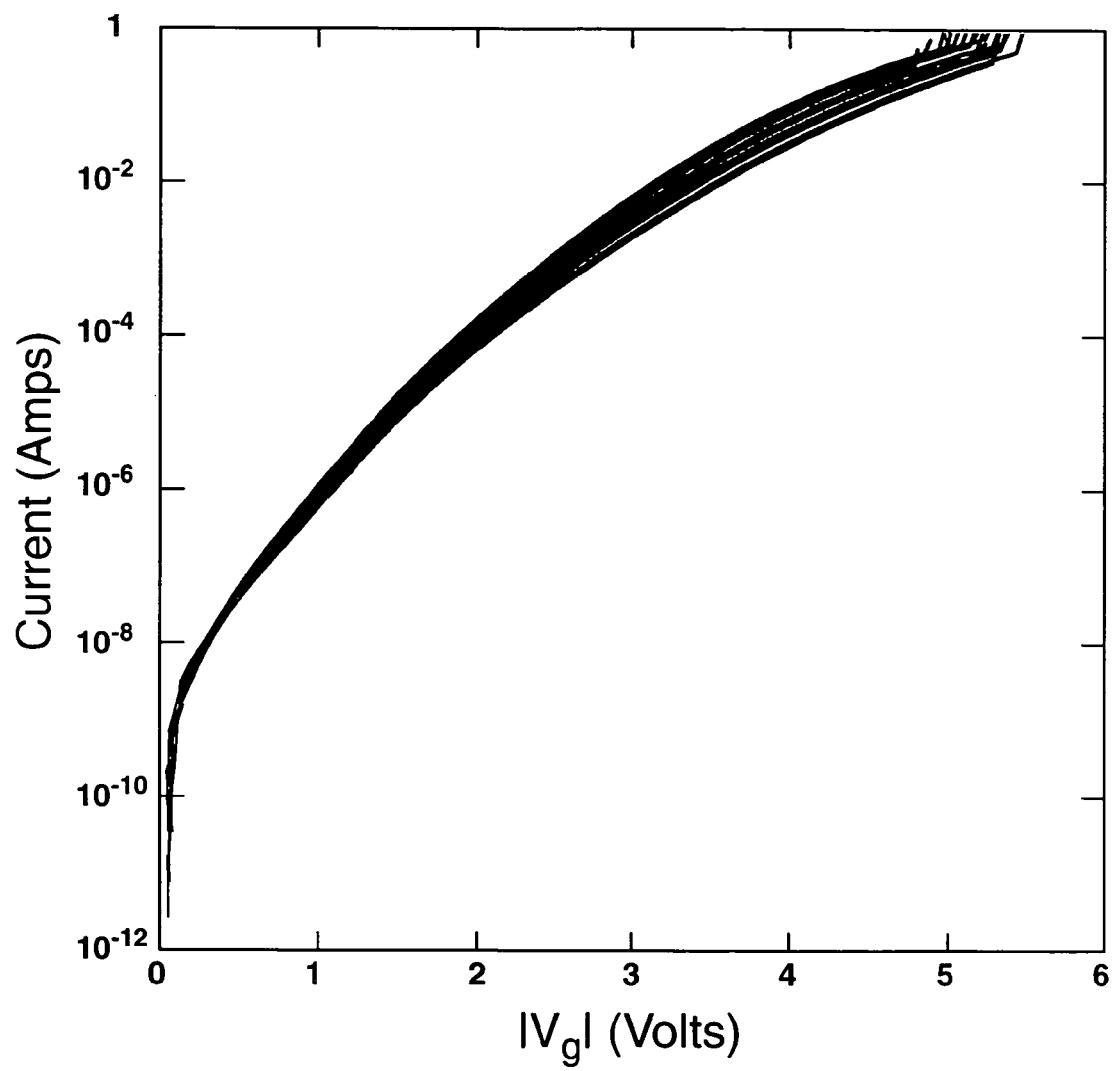
FIG. 9 shows a series of I-V curves for 20 antifuses having a single 15-nm-thick non-hydrogenated $SiN_X$ layer with X=0.75 sandwiched between a silicon lower electrode and an upper electrode comprising aluminum.

FIG. 9 shows a series of room-temperature current-vs-voltage curves for this third example of the antifuse 10 of the present invention. Two substrates 12 each containing ten antifuses having the above structure and an overall antifuse area of 1×10$^{-4}$ cm$^2$ (i.e. 100 μm square) were tested to breakdown. From these current-vs-voltage curves, the average breakdown voltage $V_{BD}$ is 5.2 Volts.

Larger breakdown voltages $V_{BD}$ are possible by increasing the thickness of the single SiN$_X$ layer in the electrically-insulating region 14, or by increasing the nitrogen content X, or both. Table 1 shows how the breakdown voltage $V_{BD}$ depends on the nitrogen content X for SiN$_X$ layers which are about 20 or 50 nm thick and having an antifuse structure as shown in FIGS. 7A and 7B. Table 1 also shows how the breakdown voltage $V_{BD}$ decreases slightly at elevated temperatures of 100° C. and 200° C.

TABLE 1

| SiN$_X$ Composition | Refractive Index n | SiN$_X$ Layer Thickness (nm) | $V_{BD}$ @27° C. (Volts) | $V_{BD}$ @100° C. (Volts) | $V_{BD}$ @200° C. (Volts) |
| --- | --- | --- | --- | --- | --- |
| SiN$_{0.75}$ | 2.67 | 20.3 | 6.8 | 6.3 | 5.5 |
| SiN$_{1.17}$ | 2.20 | 21.0 | 17.1 | 16.1 | 14.7 |
| SiN$_{1.22}$ | 2.10 | 22.5 | 20.7 | 20.0 | 19.1 |
| SiN$_{1.33}$ | 2.01 | 23.2 | 25.5 | 24.7 | 23.6 |
| SiN$_{0.75}$ | 2.67 | 45.3 | 13.4 | 12.0 | 10.0 |
| SiN$_{1.17}$ | 2.20 | 49.0 | 35.2 | 33.0 | 29.8 |
| SiN$_{1.22}$ | 2.10 | 52.0 | 49.1 | 47.2 | 44.4 |
| SiN$_{1.33}$ | 2.01 | 50.0 | 60.2 | 58.5 | 56.7 |

Figure 10:
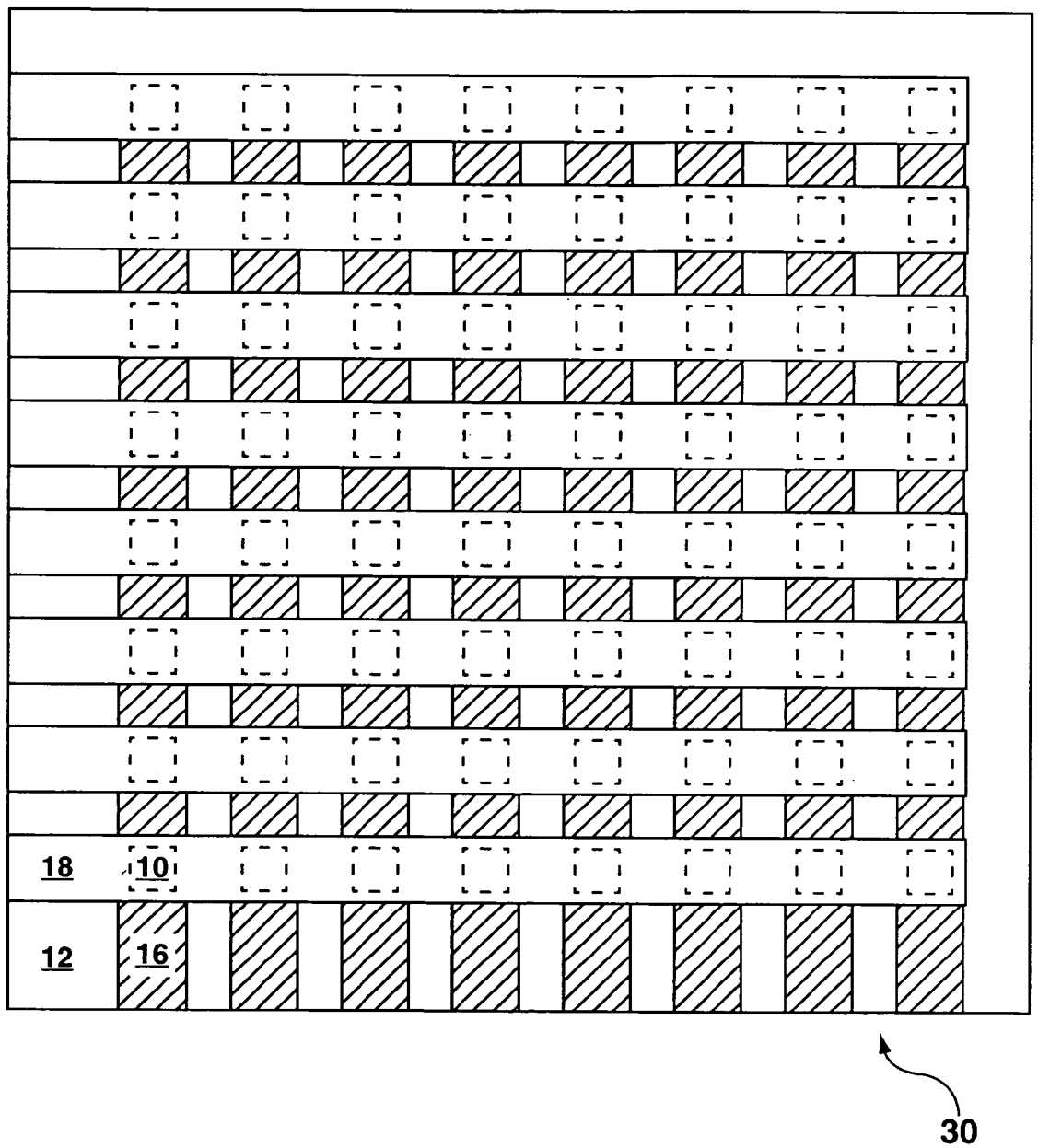
FIG. 10 shows a schematic plan view of an example of an antifuse array formed according to the present invention.

FIG. 10 shows a schematic plan view of an example of an array 30 of antifuses 10 which can be formed according to the present invention. The location of each individual antifuse 10 in the array 30 of FIG. 10 is indicated by a dashed square outline. Although, the antifuses 10 are shown in FIG. 10 with a square outline shape, those skilled in the art will know that the antifuses 10 can have an arbitrary shape and can be, for example, rectangular or circular.

Each antifuse 10 in the array 30 can be formed as previously described with reference to FIGS. 1A, 1B or FIGS. 6A, 6B to provide independent row and column addressing for that antifuse 10. Each antifuse 10 in the array 30 comprises a single layer of non-hydrogenated silicon-rich silicon nitride (SiN$_X$) with a layer thickness in the range of 10-50 nanometers and with a nitrogen content X that is generally in the range of 0<X≦1.2, and preferably in the range of 0.5≦X≦1.2. Each antifuse 10 in the array 30 further preferably has an electrical breakdown voltage which is generally ≦35 Volts, and preferably ≦10 Volts, and most preferably ≦5 Volts. The antifuse array 30 in FIG. 10 can contain up to a thousand or more individual antifuses 10 depending upon a particular application for the array 30.

In other embodiments of the present invention, a doped silicon substrate 12 can be used to provide a common lower contact 16 for a plurality of antifuses 10 formed as an array 30. The upper contact 18 for each antifuse 10 in the array 30 can be independently addressable, or alternately a plurality of antifuses 30 can be simultaneously addressed and programmed with a common upper electrode 18.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. An antifuse, comprising:
   an electrically-insulating region consisting of a single layer of non-hydrogenated silicon-rich silicon nitride (SiN$_X$) 10-50 nanometers thick with a nitrogen content X in the range 0<X≦1.2, and with an electrical breakdown voltage ≦10 Volts; and
   electrodes above and below the electrically-insulating region, with each electrode being in physical contact with the electrically-insulating region to provide the electrical breakdown voltage to program the antifuse without heat being transferred from the electrodes to the electrically-insulating region prior to breakdown of the electrically-insulating region.

2. The antifuse of claim 1 wherein at least one of the electrodes comprises a metal or metal alloy.

3. The antifuse of claim 1 wherein the electrode below the electrically-insulating region comprises a metal silicide.

4. The antifuse of claim 3 wherein the metal silicide comprises titanium silicide.

5. The antifuse of claim 3 wherein the electrode above the electrically-insulating region comprises a metal selected from the group consisting of titanium, tungsten, aluminum, copper and alloys thereof.

6. The antifuse of claim 1 wherein at least one of the electrodes comprises silicon.

7. The antifuse of claim 1 wherein the nitrogen content X is in the range 0.5≦X≦1.2.

8. The antifuse of claim 1 wherein the electrical breakdown voltage is ≦5 Volts.

9. The antifuse of claim 1 wherein only a single voltage is applied across the electrodes to program the antifuse and to provide the electrical breakdown voltage.

10. An antifuse, comprising:
    a first electrode formed on a silicon substrate;
    a single insulating layer deposited over the first electrode, with the single insulating layer being in physical contact with the first electrode, and with the single insulating layer being 10-50 nanometers thick, and consisting of a silicon-rich silicon nitride having a composition SiN$_X$ with a nitrogen content X which provides an electrical breakdown voltage less than or equal to 10 Volts; and
    a second electrode formed over the single insulating layer, with the single insulating layer being in physical contact with the second electrode, and with the first and second electrodes not being a source of heat to reduce the electrical breakdown voltage.

11. The antifuse of claim 10 wherein 0.5≦X≦1.2.

12. The antifuse of claim 10 further comprising an electrical isolation layer deposited over the silicon substrate and having an opening wherein the single insulating layer contacts the first electrode.

13. The antifuse of claim 10 wherein at least one of the first and second electrodes consists of silicon which is doped with an n-type dopant or with a p-type dopant.

14. The antifuse of claim 10 wherein at least one of the first and second electrodes comprises titanium.

15. The antifuse of claim 10 wherein the electrical breakdown voltage is $\leq 5$ Volts.

16. The antifuse of claim 10 wherein only a single voltage is applied across the electrodes to program the antifuse and to provide the electrical breakdown voltage.

17. An array of antifuses formed on a silicon substrate, with each antifuse comprising:
- an electrically-insulating region consisting of a single layer of non-hydrogenated silicon-rich silicon nitride ($SiN_x$) 10-50 nanometers thick with a nitrogen content X in the range of $0<X\leq 1.2$, and with an electrical breakdown voltage $\leq 10$ Volts; and
- addressing electrodes above and below the electrically-insulating region and in physical contact therewith to program each antifuse with only a single voltage applied across all of the addressing electrodes for that antifuse.

18. The array of antifuses in claim 17 wherein the electrical breakdown voltage is $\leq 5$ Volts.

19. The array of antifuses in claim 17 wherein the nitrogen content X is in the range $0.5 \leq X \leq 1.2$.

20. The array of antifuses in claim 17 wherein the addressing electrodes below the electrically-insulating region comprise a metal silicide.

21. The array of antifuses in claim 20 wherein the addressing electrodes above the electrically-insulating region comprise tungsten.

22. The array of antifuses in claim 17 wherein at least one of the addressing electrodes comprises silicon.

23. The array of antifuses in claim 17 wherein the addressing electrodes do not heat the electrically-insulating region prior to breakdown of the electrically-insulating region.

* * * * *